United States Patent
Wasson et al.

(10) Patent No.: US 6,875,546 B2
(45) Date of Patent: Apr. 5, 2005

(54) METHOD OF PATTERNING PHOTORESIST ON A WAFER USING AN ATTENUATED PHASE SHIFT MASK

(75) Inventors: James R. Wasson, Tempe, AZ (US); Pawitter Mangat, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 94 days.

(21) Appl. No.: 10/377,844

(22) Filed: Mar. 3, 2003

(65) Prior Publication Data

US 2004/0175629 A1 Sep. 9, 2004

(51) Int. Cl.$^7$ ................................................. G03F 9/00
(52) U.S. Cl. ............................................................. 430/5
(58) Field of Search .................... 430/5, 322; 378/35; 428/428, 430

(56) References Cited

U.S. PATENT DOCUMENTS

| | | | |
|---|---|---|---|
| 5,052,033 A | 9/1991 | Ikeda | |
| 5,286,581 A | 2/1994 | Lee | |
| 6,410,193 B1 | 6/2002 | Stivers | |
| 2004/0126670 A1 * | 7/2004 | Liang et al. | 430/5 |
| 2004/0131948 A1 * | 7/2004 | Yan | 430/5 |

FOREIGN PATENT DOCUMENTS

WO    WO 00/42473    7/2000

OTHER PUBLICATIONS

Yokoyama et al., "The Development of Bilayered TaSiOx–HTPSM (1)," Proceedings of SPH vol. 4409 (2001), pp. 164–171.

Yokoyama et al., "The Development of Bilayered TaSiOx–HTPSM (2)," Proceedings of SPH vol. 4409 (2001), pp. 164–171.

* cited by examiner

*Primary Examiner*—S. Rosasco
(74) *Attorney, Agent, or Firm*—James L. Clingan, Jr.; Joanna G. Chiu

(57) ABSTRACT

An attenuated phase shift mask (10 or 20) includes a substrate (12 or 22) and an attenuation stack (11 or 21) overlying the substrate. The attenuation stack includes a chromium layer or ruthenium layer (14 or 24) overlying the substrate, a tantalum silicon oxide layer (16 or 26) overlying the chromium layer or the ruthenium layer, and a tantalum silicon nitride layer (18 or 28) overlying the tantalum silicon oxide layer. The attenuation stack may also include a layer (30) between the substrate (22) and the chromium or ruthenium layer (24). In one embodiment, this layer is a portion of the substrate. The attenuation stack is used to pattern photoresist (50) on a semiconductor wafer. In one embodiment, portions of the substrate adjacent the attenuation stack has a transmission of greater than 90 percent and the attenuation stack has a transmission of 5 to 20 percent at the exposure wavelength. In one embodiment, an inspection contrast between the substrate and the attenuation stack at an inspection wavelength is greater than 75 percent.

30 Claims, 1 Drawing Sheet

METHOD OF PATTERNING PHOTORESIST ON A WAFER USING AN ATTENUATED PHASE SHIFT MASK

RELATED APPLICATIONS

This application is related to U.S. patent application Ser. No. SC12350TP, titled "A method of Patterning Photoresist on a Wafer Using a Reflective Mask with a Multi-Layer ARC," filed on even date herewith, and assigned to the assignee hereof.

FIELD OF THE INVENTION

This invention relates to making integrated circuits using attenuated phase shift masks, and more particularly, to making integrated circuits using attenuated phase shift masks with a low wavelength illumination source.

RELATED ART

Phase shift masks (PSMs) have been found to be very useful in making sharp contrasts in photoresist, which has become more important as circuit features become smaller and smaller. One of the problems with phase shift masks was phase conflicts that occurred due to the multiple changes in phase shift that occur throughout the mask. This occurred because the different sides of a feature of the mask had different phase. Attenuated PSMs were developed to overcome this problem by having the phase shift only at the feature itself. Thus the areas surrounding the features are at the same phase. One of the difficulties with attenuated PSMs is the ability to perform an effective inspection. There typically is little contrast in the reflection between the feature and the area that is transmissive. Further, as the demand for higher feature density and thus lower dimensions continues, the light source must provide sufficient resolution. Thus, there is a demand for continued increases in frequency of the source of illumination for exposing photoresist from patterned light passing through the mask. In the case of attenuated PSMs, one the difficulties is finding materials that achieve the desired attenuation, which is between about 5% and 20% transmission, and the desired phase shift while also being manufacturable. A key feature for manufacturability is the ability to provide an effective inspection. A mask cannot have a defect that is transmitted to the photoresist on the wafer.

Thus, there is a need for a making semiconductors at lower wavelengths that can be effectively manufactured using attenuated PSMs.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment a photoresist layer on a semiconductor wafer is patterned using an attenuated phase shift mask (attenuated PSM) using an attenuation stack that has a chromium or ruthenium layer adjacent to a transmissive substrate, a tantalum silicon oxide layer adjacent to the layer that is ruthenium or chromium, and a tantalum silicon nitride layer that is adjacent to the tantalum silicon oxide layer. This provides three different layers that can be adjusted to achieve the desired attenuation, achieve the needed 180 degree phase shift, and be able to be effectively inspected. As an alternative, the transmissive substrate can be etched around the stack so that the material of the transmissive substrate provides additional adjustment for achieving the needed phase shift in the stack. This is better understood by reference to the drawings and the following description.

Figures 1, 2:
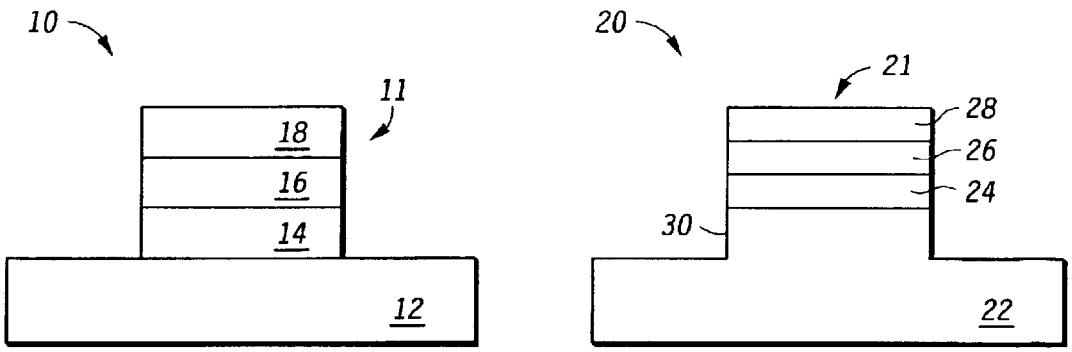
FIG. 1 is a cross section of a mask according to a first embodiment of the invention.
FIG. 2 is a cross section of a mask according to a second embodiment of the invention.

Shown in FIG. 1 is a mask 10 having a substrate 12 and an attenuation stack 11. Attenuation stack 11 comprises a first layer 14 adjacent to the substrate that is either chromium or ruthenium, a tantalum silicon oxide layer 16 that is adjacent to the first layer, and a tantalum silicon nitride layer 18 that is adjacent to layer 16. Stack 11 is a feature on mask 10 that is for substantially blocking the exposure of photoresist on a wafer at a location on the wafer that corresponds to the location of stack 11 on mask 10. The precise composition of tantalum silicon nitride layer 18 can be varied. Similarly, the precise composition of tantalum silicon oxide layer 16 may also vary. Further, first layer 14 does not have to be pure chromium or pure ruthenium. For example, layer 14 can be doped with materials such as nitrogen or oxygen in order to make it anti-reflective at the exposure wavelength. The doping concentration should be adjusted so as to bring the amount of reflection to less than 10 percent of the incident light at the exposure wavelength. The substrate is preferably fluorine doped silicon oxide. Other materials could also be used. Such material should have at least a 90% transmission at the exposure wavelength.

The precise thicknesses for layers 14, 16, and 18 are determined experimentally to achieve the desired attenuation, needed inspection contrast, and requisite 180 degree phase shift. For a 157 nanometer light source, a preferred thickness for each layer 14–18 is about 25 to 150 Angstroms. To achieve 7.5% transmission, a thickness of about 129.8 Angstroms of chromium for layer 14, a thickness of about 38.5 Angstroms for layer 16, and a thickness of about 129.8 Angstroms for layer 18 were used. Another example is a transmission of 10.3% was achieved by thicknesses of 83.4 Angstroms, 79.5 Angstroms, 83.4 for layers 14, 16, and 18, respectively. These are dimensions that are relatively easily obtained through available mask making processes. For these results the composition of the tantalum silicon nitride was about 57% tantalum, 41% silicon and 2% nitrogen, and the composition of the tantalum silicon oxide was about 57% tantalum, 41% silicon, and 2% oxygen.

First layer 14 of ruthenium or chromium provides the largest attenuation for a given thickness of any of the layers. This layer 14 also provides for an etch stop in the manufacture of mask 10. Layers 16 and 18 are etched by chemistries that also etch substrate 12. Chlorine based etchants that do not have oxygen are known to be useful in etching tantalum silicon oxide and tantalum silicon nitride but are also known to etch silicon oxide, including fluorine doped silicon oxide. These chlorine based etchants don't react with chromium or ruthenium. The chromium or ruthenium are then etched with other chemistries, such as chlorine in combination with oxygen, that is highly reactive with chromium and ruthenium but not with silicon oxide. Thus, the chromium or ruthenium are important in providing an etch stop and in providing significant attenuation. Chromium and Ruthenium, however, are highly reflective, which creates a problem with flare in the projection optics, the optics between the semiconductor wafer and the mask. Thus, chromium and ruthenium are undesirable to use alone.

Layer 16 and layer 18 of tantalum silicon oxide and tantalum silicon nitride provide layers that have relatively low reflectivity at 257 nanometers, which is the inspection wavelength. Further, the thicknesses are variable to adjust destructive interference in the reflections that do occur. The desire for inspection is that at the inspection frequency the features, attenuation stacks such as attenuation stack 11, provide no reflection and that all of the reflection be from the exposed substrate. This provides for a high degree of contrast. Thus, the thicknesses of these two layers 16 and 18 can be selected so that there is substantially no reflection so that the inspection contrast, greater than 75%, is sufficient for effective inspection. It is desirable that layer 28, the tantalum silicon nitride layer, directly receive the inspection light, because it has higher absorption than the tantalum silicon oxide. Thus, all of the light, except that reflected by the exposed surface of layer 28, passes through the higher absorbing layer.

The thicknesses that achieve this high inspection contrast also effect the phase shift and the amount of attenuation. With these materials, there is a solution to the three important issues of attenuation from 5 to 20% and 180 degree phase shift at 157 nanometers and high inspection contrast at 257 nanometers. Each thickness of each material effects, in a different way, each of these issues. The composition of the tantalum-containing layers 26 and 28 will effect the index of refraction and coefficient of extinction of those materials. For a given mask design, it is preferable to use the same composition for each experiment and only vary the thicknesses. On the other hand, it is certainly possible to vary the composition to achieve modifications to the characteristics of these layers and thus the stack 11. Lower wavelengths than 157 nanometers addressed in a similar way. This should work at least to 150 nanometers.

Shown in FIG. 2 is a mask 20, similar to mask 10, having a substrate 22 and a stack 21. Stack 21 has, as does stack 11 of FIG. 1, sequential layers of a layer 24 of chromium or ruthenium, a layer 26 of tantalum silicon oxide, and a layer 28 of tantalum silicon nitride. Stack 21, however, has a further layer 30 that is a portion of substrate 22. Layer 30 is formed by etching back substrate 22 with the stack of layers 24, 26, and 28 acting as a mask. This etch back is controlled to provide a desired added thickness of fluorine-doped silicon oxide but should not exceed 1000 Angstroms in order to avoid too great of an aspect ratio for the stack. The presence of layer 30 allows for reducing the thickness of layers 24–28 as compared to layers 14–18. Instead of etching into the substrate itself, a separate layer could first be deposited on the substrate and then etched back after the stack has been formed. The material of layer 30 preferably has an extinction coefficient of zero, i.e., no attenuation at the illumination wavelength. This added layer 30 provides a convenient way to provide the needed phase shift while having minimal, if any, effect on the issues of inspection contrast and attenuation. This fourth variable available to the mask maker provides greater flexibility in achieving the goals of high inspection contrast, desired attenuation at a selected amount that is in the range of 5 to 20%, and 180 degree phase shift.

Figure 3:
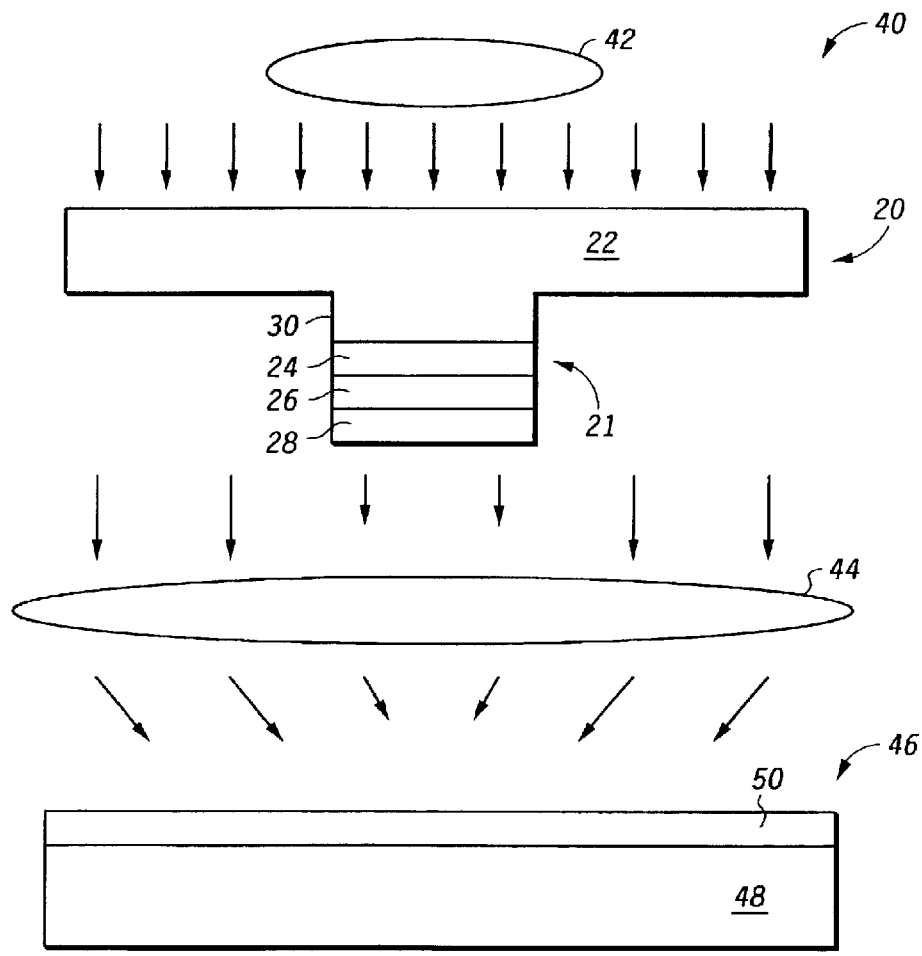
FIG. 3 is an apparatus for using the mask of FIG. 2 to pattern photoresist on a semiconductor wafer.

Shown in FIG. 3 is an arrangement 40 for using mask 20 to pattern photoresist 50 on a semiconductor wafer 48. An optical source 42 provides optical radiation (light) at the desired wavelength, preferably 157 nanometers in this case, to mask 20 that blocks such light according to the desired pattern, which is formed by stacks such as stack 21 of mask 20. The patterned light that passes through mask 20 is then processed by optical system 44 and then received by photoresist 50. In this example and as is typical, optical system 44 is a reduction optical system that performs demagnification. Photoresist 50 is thereby exposed according to the pattern present in mask 20.

In the foregoing specification, the invention has been described with reference to specific embodiments. However, one of ordinary skill in the art appreciates that various modifications and changes can be made without departing from the scope of the present invention as set forth in the claims below. For example, in some cases it may be effective to reverse the tantalum silicon nitride layer with the tantalum silicon oxide layer. It may also be desirable to add an additional layer. For example another layer adjacent to layer 28 or layer 18 may be desirable in some cases. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An attenuated phase shift mask, comprising:
a substrate; and
an attenuation stack overlying the substrate, wherein the attenuation stack comprises a first layer overlying the substrate, a tantalum silicon oxide layer overlying the first layer, and a tantalum silicon nitride layer overlying the tantalum silicon oxide layer, and wherein the first layer is one of a chromium layer or a ruthenium layer.

2. The attenuated phase shift mask of claim 1, wherein the attenuation stack further comprises a second layer between the substrate and the first layer.

3. The attenuated phase shift mask of claim 2, wherein the second layer is a portion of the substrate.

4. The attenuated phase shift mask of claim 3, wherein the second layer is formed by removing portions of the substrate adjacent to the attenuation stack.

5. The attenuated phase shift mask of claim 1, wherein portions of the substrate adjacent the attenuation stack has a transmission of greater than 90 percent at an exposure wavelength, and the attenuation stack has a transmission of 5 to 20 percent at the exposure wavelength.

6. The attenuated phase shift mask of claim 5, wherein the first layer is doped to provide a reflection of less than 10 percent at the exposure wavelength.

7. The attenuated phase shift mask of claim 1, wherein the first layer further comprises at least one of oxygen and nitrogen.

8. The attenuated phase shift mask of claim 1, wherein an inspection contrast between the substrate and the attenuation stack at an inspection wavelength is greater than 75 percent.

9. A method for patterning photoresist on a wafer utilizing optical radiation, the method comprising:
   providing an attenuated phase shift mask including a substrate and an attenuation stack overlying the substrate, the attenuation stack comprising a chromium layer or a ruthenium layer overlying the substrate, a tantalum silicon oxide layer overlying the chromium layer or the ruthenium layer, and a tantalum silicon nitride layer overlying the tantalum silicon oxide layer; and
   patterning a photoresist layer on the wafer using the mask, wherein patterning comprises passing optical radiation through the attenuated phase shift mask to expose portions of the photoresist layer.

10. The method of claim 9, wherein the optical radiation passing through the mask and exposing the photoresist layer has an exposure wavelength of at least 150 nanometers.

11. The method of claim 10, wherein the optical radiation passing through portions of the substrate of the attenuated phase shift mask adjacent to the attenuation stack has a transmission of greater than 90 percent at the exposure wavelength and the optical radiation passing through the attenuated stack has a transmission of 5 to 20 percent at the exposure wavelength.

12. The method of claim 11, wherein the attenuation stack provides a 180 degree phase shift of the optical radiation.

13. The method of claim 9, wherein the attenuation stack further comprises a layer between the substrate and the chromium layer or the ruthenium layer.

14. The method of claim 13, wherein the layer is a portion of the substrate.

15. The method of claim 14, wherein the layer is formed by removing portions of the substrate adjacent to the attenuation stack.

16. The method of claim 9, wherein the attenuation stack has a thickness of at most 1000 Angstroms.

17. The method of claim 9, wherein the attenuation stack has a thickness of at most 700 Angstroms.

18. The method of claim 9, wherein an inspection contrast between the substrate and the attenuation stack at an inspection wavelength is greater than 75 percent.

19. A method for patterning photoresist on a wafer utilizing optical radiation, the method comprising:
   providing an attenuated phase shift mask including a substrate and an attenuation stack overlying the substrate, wherein the attenuation stack comprises a first layer, a second layer, and a third layer, wherein the first layer comprises one of chromium or ruthenium, the second layer comprises tantalum silicon oxide, and the third layer comprises tantalum silicon nitride; and
   patterning a photoresist layer on the wafer using the mask, wherein patterning comprises passing optical radiation through the attenuated phase shift mask to expose portions of the photoresist layer.

20. The method of claim 19, wherein the first and second layers are between the substrate and the third layer.

21. The method of claim 19, wherein the second and third layers are between the substrate and the first layer.

22. The method of claim 19, wherein portions of the substrate adjacent to the attenuation stack are removed to form a fourth layer of the attenuation stack.

23. The method of claim 22, wherein the attenuation stack includes only the first, second, third, and fourth layers.

24. The method of claim 19, wherein the attenuation stack includes only the first, second, and third layers.

25. The method of claim 19, wherein the optical radiation passing through the mask and exposing the photoresist layer has a wavelength of at least 157 nanometers, and wherein the optical radiation passing through portions of the substrate of the attenuated phase shift mask adjacent to the attenuation stack has a transmission of greater than 90 percent and the optical radiation passing through the attenuated stack has a transmission of 5 to 20 percent.

26. The method of claim 25, wherein the attenuation stack provides a 180 degree phase shift of the optical radiation.

27. The attenuated phase shift mask of claim 25, wherein the first layer is doped to provide a reflection of less than 10 percent of the optical radiation.

28. The method of claim 19, wherein the attenuation stack has a thickness of at most 1000 Angstroms.

29. The method of claim 19, wherein an inspection contrast between the substrate and the attenuation stack at an inspection wavelength is greater than 75 percent.

30. The attenuated phase shift mask of claim 19, wherein the first layer further comprises at least one of oxygen and nitrogen.

* * * * *